(12) United States Patent
Huang et al.

(10) Patent No.: US 8,836,655 B2
(45) Date of Patent: Sep. 16, 2014

(54) MOBILE DEVICE WITH SUPPORTING STRUCTURES FOR DISPLAY

(75) Inventors: Jen-Shiun Huang, Hsinchu (TW); Tsung-Yi Lin, Hsinchu (TW); Ming-Hui Chiang, Hsinchu (TW); Wan-Tien Chen, Hsinchu (TW); Wen-Jen Lee, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 231 days.

(21) Appl. No.: 13/285,001

(22) Filed: Oct. 31, 2011

(65) Prior Publication Data

US 2012/0229390 A1    Sep. 13, 2012

(30) Foreign Application Priority Data

Mar. 9, 2011    (TW) .............................. 100107962 A

(51) Int. Cl.
*G06F 3/041*    (2006.01)
*H01L 27/32*    (2006.01)

(52) U.S. Cl.
CPC ............. *G06F 3/0418* (2013.01); *H01L 27/323* (2013.01); *G06F 3/0414* (2013.01)
USPC ........................................................ 345/173

(58) Field of Classification Search
None
See application file for complete search history.

(56) References Cited

U.S. PATENT DOCUMENTS

2002/0054261 A1*    5/2002    Sekiguchi ..................... 349/122
2009/0322496 A1*    12/2009    da Costa .................... 340/407.2

FOREIGN PATENT DOCUMENTS

| CN | 101807093 A | | 8/2010 |
| JP | 04022022 A | * | 1/1992 |
| JP | 2002259052 A | * | 9/2002 |
| TW | 201035823 | | 10/2010 |
| TW | 201107821 A1 | | 3/2011 |

OTHER PUBLICATIONS

TW Office Action that these art references were cited.
Corresponding CN office action that this art reference was cited.

* cited by examiner

*Primary Examiner* — David D Davis
(74) *Attorney, Agent, or Firm* — CKC & Partners Co., Ltd.

(57) ABSTRACT

A mobile device is disclosed. The mobile device includes a display, a touch panel, and a buffer structure. The touch panel is disposed on one side of the display. The buffer structure has a gas fluid layer and is disposed between the display and the touch panel.

7 Claims, 3 Drawing Sheets

MOBILE DEVICE WITH SUPPORTING STRUCTURES FOR DISPLAY

RELATED APPLICATIONS

This application claims priority to Taiwan Application Serial Number 100107962, filed Mar. 9, 2011, which is herein incorporated by reference.

BACKGROUND

1. Field of Disclosure

The present disclosure relates to a mobile device. More particularly, the present disclosure relates to a mobile device with a rear-type touch panel.

2. Description of Related Art

Along with the development of 3C (Computer, Communications and Consumer) industries, more and more people are using mobile devices as an assistance tool in their daily life. Common mobile devices include personal digital assistants (PDAs), mobile phones, smart phones and so on. These mobile devices are small in size and easy to carry, and as a result, the number of people using mobile devices is increasing, as is the number of functions required on mobile devices.

Touch screens having displays and touch panels, in which the touch panels function as touch-sensitive layers, are widely utilized in mobile devices. Most touch panels are arranged on top of the displays, and such placement of the touch panel over the display may lead to a drop in image quality. Therefore, a mobile device with a rear-type touch panel is provided, in which the display and the touch panel are located at opposite sides of the mobile device to solve the problem of the touch panel causing a drop in image quality as a result of being placed over the display, and also to reduce the use of transparent conductive material, such as ITO and IZO, when the touch panel is made.

FIG. 1 is a sectional diagram of a typical mobile device with a rear-type touch panel. The display 110 and the touch panel 120 are attached to one another with an adhesive 130 in the mobile device 100. However, with this configuration, as the size of the display 110 becomes larger and larger, bending of the display 110 due to gravity occurs. The pressure generated by the bending of the display 110 due to gravity is transmitted to the touch panel 120, and a false signal, which is not generated by the user, is generated at the position 112 where the pressure is applied.

Hence, there is a need to prevent false signals from being generated in the mobile device with a rear-type touch panel.

SUMMARY

The disclosure provides a mobile device having an internal buffer structure to prevent the generation of false signals of the touch panel.

An embodiment of the disclosure provides a mobile device, which includes a display, a touch panel, and a buffer structure. The touch panel is disposed on one side of the mobile device. The buffer structure has a gas fluid layer and is disposed between the display and the touch panel. The buffer structure includes at least one spacer disposed at a non-operating area between the display and the touch panel. The spacer can be formed of a sealant material. The mobile device further includes a casing, and the display and the touch panel are disposed in the casing. The buffer structure may include plural support ribs disposed on the casing for supporting the display. The buffer structure may include plural positioning ribs disposed on the casing for positioning the touch panel. The display can be an electronic paper display, a liquid crystal display, or an active matrix organic light emitting diode display. The display is not in contact with the touch panel.

The gas fluid layer separates the display and the touch panel, so that the display is not in contact with the touch panel. Thus, pressure generated by the bending of the display due to gravity is not transmitted to the touch panel, and the generation of false signals can be prevented.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
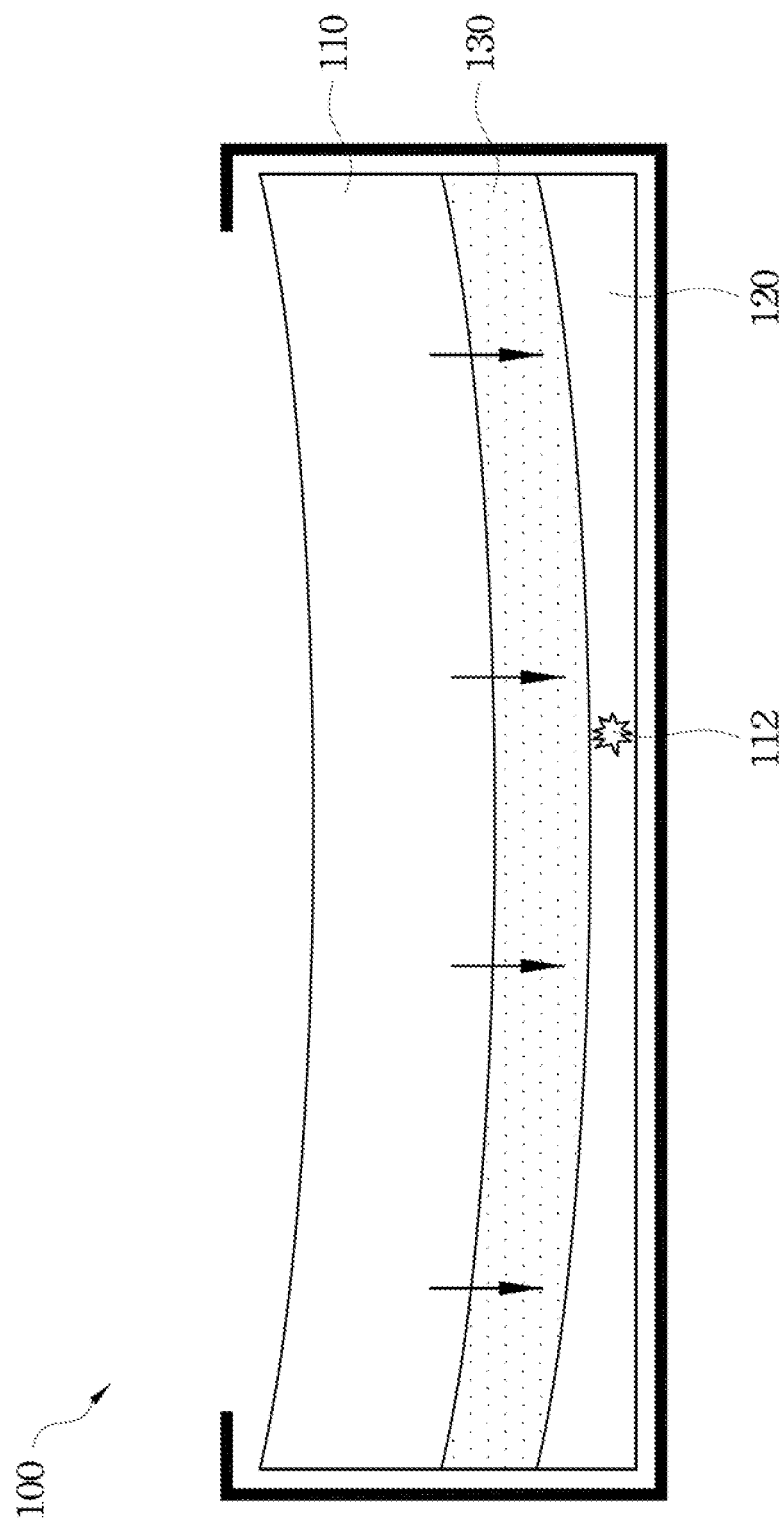
FIG. 1 is a sectional diagram of a typical mobile device with a rear-type touch panel.

Reference will now be made in detail to the present embodiments of the disclosure, examples of which are illustrated in the accompanying drawings. Wherever possible, the same reference numbers are used in the drawings and the description to refer to the same or like parts.

Figure 2:
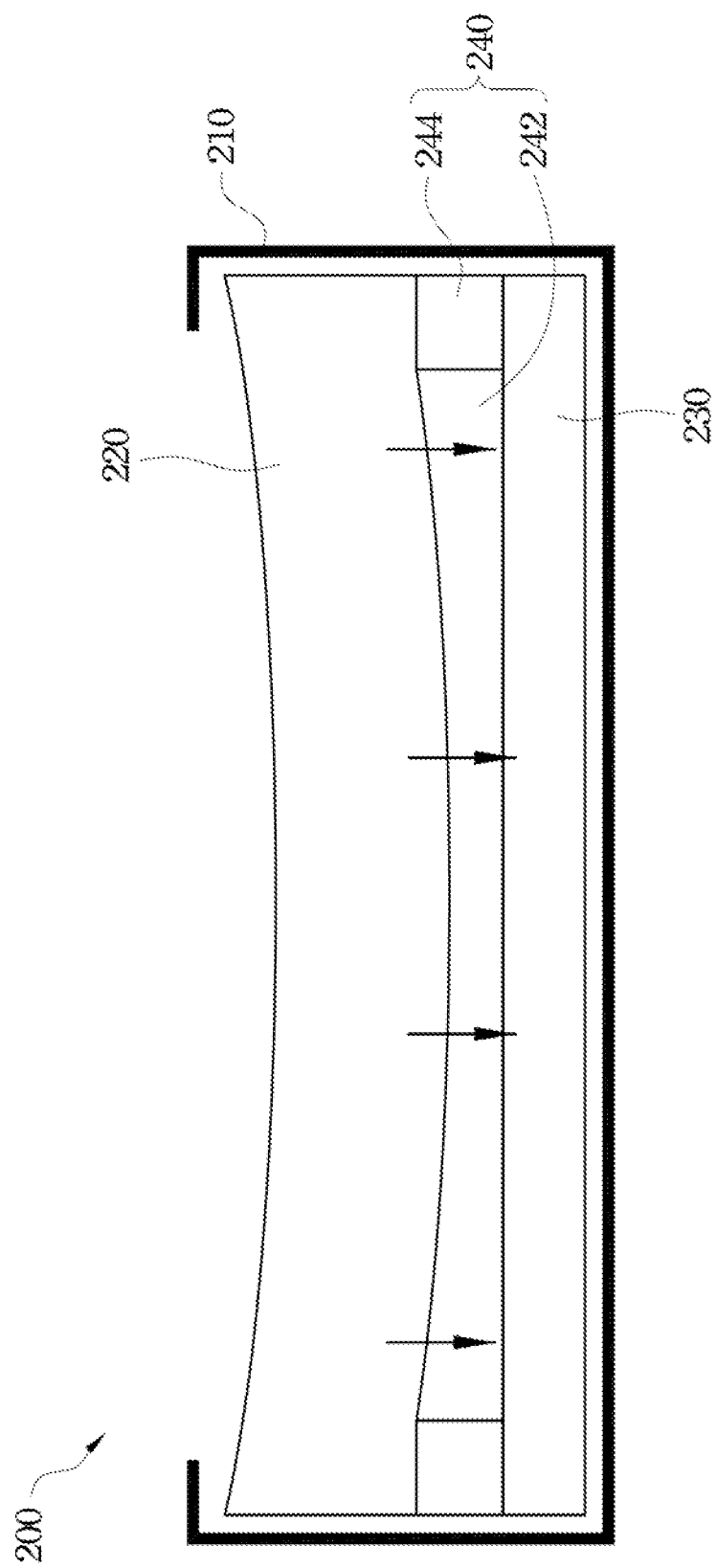
FIG. 2 is a sectional diagram of an embodiment of a mobile device of the disclosure.

FIG. 2 is a sectional diagram of an embodiment of a mobile device of the disclosure. The mobile device 200 includes a casing 210, a display 220, and a touch panel 230. The display 220 and the touch panel 230 are disposed in the casing 210. The touch panel 230 operates as a touch-sensitive layer in the mobile device 200. The touch panel 230 is disposed on one side of the display 220. Specifically, the display 220 is disposed above the touch panel 230 in the casing 210.

The mobile device 200 can be a mobile phone, a smart phone, a handheld reader, a personal digital assistant, etc. The display 220 can be a liquid crystal display, an electronic paper display, or an active matrix organic light emitting diode display.

The mobile device 200 includes a buffer structure 240 disposed between the display 220 and the touch panel 230. The buffer structure 240 is utilized for separating the display 220 and the touch panel 230, so that the display 220 does not contact the touch panel 230. False signals caused by pressure generated by the bending of the display 220 due to gravity may be prevented by the buffer structure 240.

The buffer structure 240 includes a gas fluid layer 242. The gas fluid layer 242 is disposed between the display 220 and the touch panel 230 to separate the display 220 and the touch panel 230. The display 220 is not in contact with the touch panel 230. Pressure generated by the bending of the display 220 due to gravity is not transmitted to the touch panel 230. Therefore, false signals caused by such pressure may be prevented.

The buffer structure 240 further includes at least one spacer 244. The spacer 244 is disposed at a non-operating area between the display 220 and the touch panel 230. The spacer 244 is disposed around the edge of the mobile device 200 to define a chamber in which the gas fluid layer 242 is disposed. The spacer 244 may be made of a sealant material. The spacer 244 can be used to position the display 220 and the touch panel 230 in the casing 210.

Figure 3:
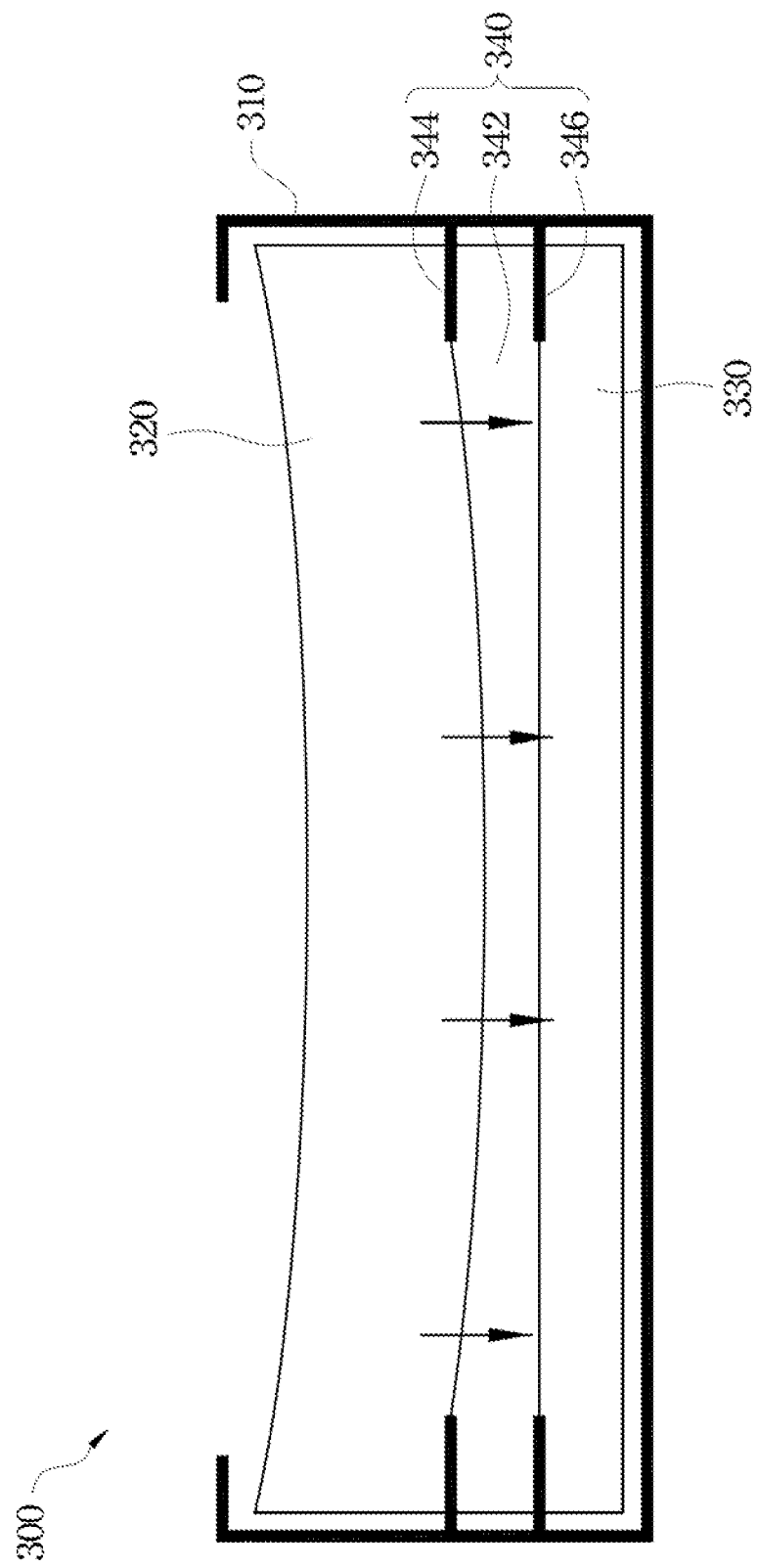
FIG. 3 is a sectional diagram of another embodiment of a mobile device of the disclosure.

FIG. 3 is a sectional diagram of another embodiment of a mobile device of the disclosure. The mobile device 300 includes the casing 310, the display 320, and the touch panel 330. The display 320 and the touch panel 330 are disposed in the casing 310. The touch panel 330 is disposed on one side of the display 320. Specifically, the display 320 is disposed above the touch panel 330 in the casing 310. The mobile device 300 can be a mobile phone, a smart phone, a handheld reader, a personal digital assistant, etc. The display 320 can be a liquid crystal display, an electronic paper display, or an active matrix organic light emitting diode display. The mobile device 300 includes the buffer structure 340 disposed between the display 320 and the touch panel 330 to separate the display 320 and the touch panel 330, so that the display 320 is not in contact with the touch panel 330. False signals caused by pressure generated by the bending of the display 320 due to gravity may be prevented by the buffer structure.

The buffer structure 340 includes the gas fluid layer 342. The gas fluid layer 342 is disposed between the display 320 and the touch panel 330 to separate the display 320 and the touch panel 330. The display 320 is not in contact with the touch panel 330. Pressure generated by the bending of the display 320 due to gravity is not transmitted to the touch panel 330. Therefore, false signals caused by such pressure may be prevented.

The buffer structure 340 further includes a plurality of supporting ribs 344 disposed on the casing 310. The display 320 is supported by the supporting ribs 344, and as a result, the display 320 is not in contact with the touch panel 330. The supporting ribs 344 can continuously support a peripheral portion of the display 320, or may support the peripheral portion of the display 320 at selection areas thereof. The buffer structure 340 further includes a plurality of positioning ribs 346 disposed on the casing 310 to position the touch panel 330. The material of the supporting ribs 344, the positioning ribs 346, and the casing 310 can be the same. The supporting ribs 344 and the positioning ribs 346 can be integrally formed on the casing 310. The gas fluid layer 342 is formed between the supporting ribs 344 and the positioning ribs 346.

According to above embodiments, the present disclosure has the following advantages. The gas fluid layer separates the display and the touch panel, so that the display is not in contact with the touch panel. Thus, pressure generated by the bending of the display due to gravity is not transmitted to the touch panel, and the generation of false signals can be prevented.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A mobile device capable of touch-sensing comprising:
   a display;
   a touch panel disposed on one side of the display;
   a casing, wherein the display and the touch panel are disposed in the casing, and wherein the casing has a plurality of supporting ribs and a plurality of positioning ribs; and
   a buffer structure comprising a gas fluid layer;
   wherein the supporting ribs and the positioning ribs are disposed between the display and the touch panel,
   wherein the supporting ribs are in contact with the display and spaced apart from the touch panel, and the positioning ribs are in contact with the touch panel and spaced apart from the display,
   wherein the gas fluid layer is in contact with the supporting ribs and the positioning ribs,
   wherein the gas fluid layer is in contact with the display and the touch panel,
   wherein the casing is formed as a one-piece unitary structure with the supporting ribs and the positioning ribs.

2. The mobile device of claim 1, wherein the buffer structure comprises at least one spacer disposed at a non-operating area between the display and the touch panel.

3. The mobile device of claim 2, wherein the spacer is formed of a sealant material.

4. The mobile device of claim 1, wherein the display is an electronic paper display.

5. The mobile device of claim 1, wherein the display is a liquid crystal display.

6. The mobile device of claim 1, wherein the display is an active matrix organic light emitting diode display.

7. The mobile device of claim 1, wherein the display is not in contact with the touch panel.

* * * * *